(12) United States Patent
Knippelmeyer

(10) Patent No.: US 7,084,406 B2
(45) Date of Patent: Aug. 1, 2006

(54) DETECTOR ARRANGEMENT AND DETECTION METHOD

(75) Inventor: Rainer Knippelmeyer, Aalen (DE)

(73) Assignee: Carl Zeiss NTS GmbH (DE)

( * ) Notice: Subject to any disclaimer, the term of this patent is extended or adjusted under 35 U.S.C. 154(b) by 0 days.

(21) Appl. No.: 10/294,609

(22) Filed: Nov. 15, 2002

(65) Prior Publication Data

US 2003/0116717 A1  Jun. 26, 2003

(30) Foreign Application Priority Data

Nov. 16, 2001  (DE) ................................ 101 56 275

(51) Int. Cl.
*G01K 1/08* (2006.01)
(52) U.S. Cl. ..................... 250/397; 250/287; 250/310
(58) Field of Classification Search ................. 250/397
See application file for complete search history.

(56) References Cited

U.S. PATENT DOCUMENTS

| | | | |
|---|---|---|---|
| 3,449,758 A | 6/1969 | Lavine | |
| 3,682,064 A | 8/1972 | Matsunaga et al. | |
| 4,068,123 A | 1/1978 | Kokubo | |
| 4,376,249 A | 3/1983 | Pfeiffer et al. | |
| 4,631,598 A * | 12/1986 | Burkhardt et al. | 358/425 |
| 4,894,701 A * | 1/1990 | Erhardt et al. | 257/233 |
| 4,962,303 A | 10/1990 | Chu | |
| 5,105,248 A * | 4/1992 | Burke et al. | 257/457 |
| 5,233,197 A | 8/1993 | Bowman et al. | |
| 5,254,857 A | 10/1993 | Ross et al. | |
| 5,578,821 A | 11/1996 | Meisberger et al. | |
| 5,598,208 A | 1/1997 | McClintock | |
| 5,659,172 A | 8/1997 | Wagner et al. | |
| 5,866,905 A | 2/1999 | Shigeto et al. | |
| 5,892,224 A | 4/1999 | Nakasuji | |
| 5,912,699 A | 6/1999 | Hayenga et al. | |
| 6,087,659 A | 7/2000 | Adler et al. | |
| 6,157,409 A | 12/2000 | Riches | |
| 6,184,526 B1 | 2/2001 | Kohama et al. | |
| 6,452,190 B1 | 9/2002 | Bolk et al. | |

(Continued)

FOREIGN PATENT DOCUMENTS

DE  24 36 160 A  2/1975

(Continued)

OTHER PUBLICATIONS

Goto, et al., "MOL (moving objective lens) Formulation of Deflective Aberration Free System", Optik 48, No. 3, 1977, pp. 255-270.

(Continued)

*Primary Examiner*—Nikita Wells
*Assistant Examiner*—Phillip A. Johnston
(74) *Attorney, Agent, or Firm*—Jones Day

(57) ABSTRACT

A detector arrangement for detecting position information contained in a beam (5) of charged particles is provided, comprising a plurality of position-sensitive detectors (17), each for supplying an image containing the position information of a position-dependent distribution of intensity, integrated in terms of time, of charged particles impinging on a detection area (19) of the detector (17), a control system (47) configured to receive the image supplied by the detectors (17), and a deflector (3) configured to direct the beam (5) of charged particles to the detection area (19) of a first detector (17) selectable from the plurality of detectors (17), the deflector (3) being controllable by the control system (47) to select the detector (17) from the plurality of detectors (17) to which the beam (5) is to be directed.

50 Claims, 6 Drawing Sheets

U.S. PATENT DOCUMENTS 6,518,582 B1 * 2/2003 Kohama ............... 250/492.2

FOREIGN PATENT DOCUMENTS

| DE | 39 28 836 A1 | | 12/1990 |
|---|---|---|---|
| EP | 0 474 483 A2 | | 3/1992 |
| JP | 2000-164167 | | 6/2000 |
| JP | 2000-252330 | * | 9/2000 |
| WO | WO 90/03043 | | 3/1990 |

OTHER PUBLICATIONS

"PB-MV40 4 Megapixel CMOS Active-Pixel Digital Image Sensor", PB-MV40 Product Specification (Version 1.0), Sep. 2001, Photobit Technology Corporation, Pasadena, CA.

"High Speed Imaging Products" [online, retrieved on Oct. 15, 2001], Cordon Scientific Imaging, Retrieved from the Internet: <URL: http://www.cordin.com/products.htm>.

"Imacon 468 Ultra High-Speed Digital Imaging System", [online, retrieved on Oct. 24, 2001], DRS Hadland, Retrieved from the Internet: <URL:http://.www.hadlandphoto.com.au/DRS%20Hadland.htm>.

"Random Access Charge Injection Device Scientific Imaging Sensors", CIDTEC, Liverpool, NY, undated product brochure.

D. Krahl et al., "Design performance and perspectives of SESAMI", "Dreiländertagung für Elektronenmikroskopie" (Abstract), A conference on Modern Microscopical Methods, Innsbruck, Sep. 9-14, 2001.

C. Weiβbäcker, et al., "Electrostatic correction of the chromatic and the spherical aberration of charged particle lenses" (Abstract), "Dreiländertagung für Elektronenmikroskopie", A conference on Modern Microscopical Methods, Innsbruck, Sep. 9-14, 2001.

O. Bostanjoglo, et al., "The nanosecond multi-frame transmission electron microscope based on a laser-driven photocathode" (Abstract), "Dreiländertagung für Elektronenmikroskopie", A conference on Modern Microscopical Methods, Innsbruck, Sep. 9-14, 2001.

Roy A. Tucker, "An Economical Astronomical Data Collection System," retrieved from the Internet on Nov. 29, 2004, from http://www.bellatrixobservatory.org/cvaal/32/.

T.D.F. Farrell, "Time Delay and Intégration for Astronomical Research," Chapter 2, pp. 24-39, Jun. 2001, retrieved from the Internet on Nov. 29, 2004, from http://www.rmc.ca/academic/physics/theses_e.html.

* cited by examiner

DETECTOR ARRANGEMENT AND DETECTION METHOD

This application corresponds to German Patent Application No. 101 56 275.6, filed on Nov. 16, 2001, the entire contents of which are incorporated herein by reference.

BACKGROUND

1. Field of the Invention

The present invention relates to a detector arrangement and a detection method. More particularly, the present invention relates to a detector arrangement and a detection method for detecting position information contained in a beam of charged particles, such as in the field of electron microscopy.

2. Background Information

In a conventional scanning electron microscope (SEM), as known, for example, from U.S. Pat. No. 5,578,821, a beam of electrons is focused onto a point (pixel) of the object to be examined. Backscattering electrons, secondary electrons or transmission electrons produced in the object by the electrons of the focused beam are detected by a detector arrangement provided for the respective purpose. A deflector is used to displace the position at which the focused beam impinges on the object. The respective detector arrangements as such are not position-sensitive but integrally receive all backscattering, secondary or transmissions electrons. An image comprising position information of the examined object, however, can be obtained from an intensity of backscattering, secondary or transmission electrons detected by a detector arrangement associated with the position determined by the deflector at which the focused beam impinges on the object. The deflector serves to successively scan the beam over different positions (pixels) of the object, and the intensities allocated to the different positions are detected to compose therefrom the image of the object containing position information. Such a detection method, wherein the intensity of charged particles originating from merely one pixel of the object is constantly detected, is very time-consuming.

U.S. Pat. No. 6,087,659 discloses an electron-microscopic detector arrangement wherein a two-dimensionally extended field on the object is irradiated with primary electrons and wherein secondary electrons emerging from the object are imaged on a position-sensitive detector by means of an optical imaging system. In contrast to the system disclosed in U.S. Pat. No. 5,578,821, this renders it superfluous to sequentially scan merely individual pixels by means of a deflector. Rather, a multiplicity of pixels of the object can be simultaneously detected by means of the position-sensitive detector. An image of the object containing position information can thus be supplied by the position-sensitive detector at once so that it is not necessary to construct this image by composing individual pixels sequentially over time.

SUMMARY

If a conventional CCD detector is used in such a method as described above as a position-sensitive detector, the amount of position information of the object which can be obtained per unit of time is limited and is felt to be too small for advanced applications.

Accordingly, it is an object of the present invention to provide a detector arrangement and a detection method for detecting position information contained in a beam of charged particles wherein an amount of position information obtainable per unit of time is increased.

Moreover, it is an object of the invention to provide an electron microscopy apparatus, in particular a backscattering electron microscope or/and a secondary electron microscope or/and a transmission electron microscope or/and a photoelectron microscope which allows the detection of position information of the object at an increased rate.

These and other objects and features will be apparent from this written description and drawings.

In the conventional detector arrangement comprising merely a single position-sensitive detector, the rate at which images containing position information can be read out from the detector is limited because the detector has a certain dead time during which the detector itself does not obtain any further image information, i.e., during which it cannot further integrate radiation intensity impinging on its detection area. During this dead time, the detector is in a dead time state.

Usually, this dead time overlaps, at least partially, with the period of time necessary to transmit an image containing position information from the detector to the respective controller. During this dead time, the beam of charged particles provides position information which, however, cannot be detected by the detector. Accordingly, the amount of position information which is detectable per unit of time by the detector arrangement could be increased if the time during which the beam of charged particles provides position information, but such position information is not detected, is reduced.

In one exemplary embodiment of the invention, there is provided an apparatus (also referred to herein as a detector arrangement) for detecting position information contained in a beam of charged particles by means of a plurality of position-sensitive detectors, each for supplying an image comprising the information, and a control system (also referred to herein as a controller) configured to receive images supplied by the detectors. In order to produce an image in a detector, a detector is exposed such that the particle beam containing the position information is directed to a detection area of the detector and the detector integrates, in terms of time, a position-dependent distribution of radiation intensity which impinges on the detection area. Said position-dependently integrated intensity of impinging radiation forms the basis of the image supplied by the detector.

The image contains the position information which corresponds to the position-dependently integrated intensity. For example, the image can be electronically represented, in particular, as binary data or as analog signal.

In addition to the plurality of position-sensitive detectors that are provided, a deflector is provided to direct the beam of charged particles to the detection area of a detector selectable from the plurality of detectors, the deflector being controllable by the controller to select the detector to which the beam is to be directed from the plurality of detectors.

In one example, the beam of charged particles can at all times be directed only to the detection area of a single detector. However, a deflector is provided by means of which the beam is deflectable so that it can be selectively directed to the detection area of each one of said plurality of detectors. During the dead time of a previously exposed detector, the beam of charged particles can then be directed to another one of the detectors which is currently not in a dead time state in order to be able to also detect the position information contained in the beam of charged particles when the previously exposed detector is in its dead time state. The controller can be configured to control the deflector such that the beam is directed successively in time and recurrently, in a periodic fashion, to the detection areas of the plurality of detectors.

Preferably, the number of detectors which are provided is selected such that substantially one detector is always available, i.e., that substantially at all times one detector is not in its dead time state. Preferably, the number of detectors is determined by a ratio, rounded to the next higher whole number, between dead time divided by exposure time of the detectors.

The detector arrangement can be used to observe an object which is changing rapidly over time. In this case, the detector arrangement enables to take more images per unit of time than it would be possible with a conventional detector arrangement comprising merely a single detector due to the dead time of said detector.

In order to observe objects, the detector arrangement preferably comprises an optical imaging system to image the object or an otherwise produced intermediate image of the object on the detection area of the detector by means of the beam of charged particles. The imaged object can comprise at least one of a photon/electron converter and a semiconductor wafer having a plurality of devices thereon, for example.

Moreover, the detector arrangement can be used for a rapid observation of static objects or objects which change merely slowly over time. To this end, the optical imaging system preferably images merely a partial region of the object on the detection areas of the detectors. In this case, the optical imaging system is controllable by the controller such that the partial region of the object imaged on the detection area can be changed. For example, it is thus possible to change, substantially simultaneously with a change of the selection of the currently exposed detector, also the partial region of the object imaged on said detector and to thus successively produce a plurality of adjacent partial images of the object. The change of the partial region of the object imaged on the detector can be followed-up, for example, in that the object is mechanically displaced relative to the detector arrangement. However, it is also possible to change the partial region imaged on the detector solely by changing optical parameters of the optical imaging system or/and in combination with a change of the optical parameters and the mechanical displacement. Images of a plurality of partial regions of the object can be transmitted to a plurality of memory areas and can be combined and outputted as a full image of the object.

The charged particles imaged on the detection area can be, for example, ions or also positrons. However, the detector arrangement is preferably used for detecting electrons, in particular, in electron microscopy. In this case, the detected electrons can preferably comprise at least one of backscattering electrons, secondary electrons, transmission electrons, and photoelectrons.

In order to produce the charged particles which are transmitted to the detection area, preferably an illumination system is provided which supplies energy at least to a partial region of the object in order to enable the charged particles to emerge from said partial region of the object. The illumination system can be at least one of an electron source, a photon source, and an ion source.

According to a preferred embodiment for observing rapid changes in the object, the illumination system is a pulsed illumination system controlled by the controller. In this case, the controller changes the selection of the detector on which the object is imaged by means of the beam of charged particles preferably every time the illumination system has supplied a predetermined number of energy pulses, in particular, exactly one energy pulse to the object.

Apart from the observation of electrons which are produced directly in or at the surface of the object to be examined, the detector arrangement can also be used to observe charged particles, in particular, electrons which carry position information of an object and are produced in an intermediate process. Such an intermediate process can be, for example, a light-optical intermediate process wherein the object to be observed is light-optically imaged on a photon/electron converter which converts the photons originating from the object position-dependently into electrons which are then imaged on the detection areas of the detectors by means of the optical imaging system. In this way, a high pick-up rate of images of a light-optically observed object is enabled.

Preferably, the optical imaging system provides an image plane or image area in which the position information contained in the particle beam results into a particularly high position-dependency of the particle intensity. Preferably, the detection areas of the plurality of detectors are substantially arranged in this image plane or image area. The image area need not necessarily have the shape of a planar surface, but can also have the shape of a surface curved in space. The plurality of detection areas is one-dimensionally arranged in a row side-by-side and, correspondingly, the deflector is provided for deflecting the particle beam in merely one direction transverse to the beam direction thereof. However, it is also advantageous for the detection areas to be arranged side-by-side in a two-dimensional field and to correspondingly provide the deflector for deflecting the particle beam in two independent directions transverse to the beam direction.

Preferably, the detector is a semiconductor detector, in particular, two-dimensional detector such as a CCD detector or/and a CID detector.

According to an exemplary aspect of the present invention there is provided an apparatus for detecting position information contained in a beam of charged particles. The apparatus comprises a plurality of detectors, each for supplying an image containing position information of a position-dependent distribution of intensity, integrated in terms of time, of a beam of charged particles impinging on a detection area of each detector, each detector being a position-sensitive detector. The apparatus further comprises a control system configured to receive the images supplied by the detectors and a deflector configured to direct the beam of charged particles to the detection area of a first detector selectable from the plurality of detectors, the deflector being controllable by the control system to select the first detector from the plurality of detectors to which the beam of charged particles is to be directed.

In another exemplary aspect of the invention, there is provided an apparatus for detecting image information associated with a beam of charged particles. The apparatus comprises a plurality of area sensors (e.g., two-dimensional CCD arrays) for providing image signals in response to the beam of charged particles, a deflector for sequentially directing the beam of charged particles to selected ones of the area sensors, and a control system for controlling the deflector to sequentially direct the beam of charged particles from a first area sensor to a second area sensor.

In another exemplary aspect of the invention, there is provided a method for forming an image of an object to be observed. The method comprises providing a plurality of detectors, each detector being a position-sensitive detector and each detector being provided for integrating, in terms of time, a position-dependent intensity of a beam of charged particles impinging on a detection area during exposure times of the detector, and for supplying an image of the integrated position-dependent intensity, each detector having a dead time state during at least a part of a time required for supplying the image, during which dead time a respective detector does not integrate the intensity. The method also comprises providing a memory for receiving a plurality of images supplied by the detectors and imaging at least a partial region of the object on a detection area of a currently selected one of the plurality of detectors using the beam of charged particles and integrating the position-dependent intensity of the beam using the currently selected detector. The method also comprises determining a detector of the plurality of detectors to be a newly selected detector which is different from the currently selected detector and transmitting a first image from the previously selected detector to a memory area of the memory after the exposure time of the previously selected detector has elapsed. The method also comprises imaging the at least a partial region of the object on a detection area of the newly selected detector using the beam of charged particles and integrating the position-dependent intensity of the beam of charged particles using the newly selected detector, the imaging and integrating associated with the newly selected detector both occurring during the transmission of the image from the previously selected detector to the memory area of the memory. The method further comprises, after termination of the exposure time of the newly selected detector, transmitting an image from the newly selected detector to another memory area of the memory which is different from the memory area to which the first image from the previously selected detector is transmitted.

BRIEF DESCRIPTION OF THE FIGURES

Exemplary embodiments of the invention are described below with reference to the accompanying drawings.

DETAILED DESCRIPTION

Figure 1:
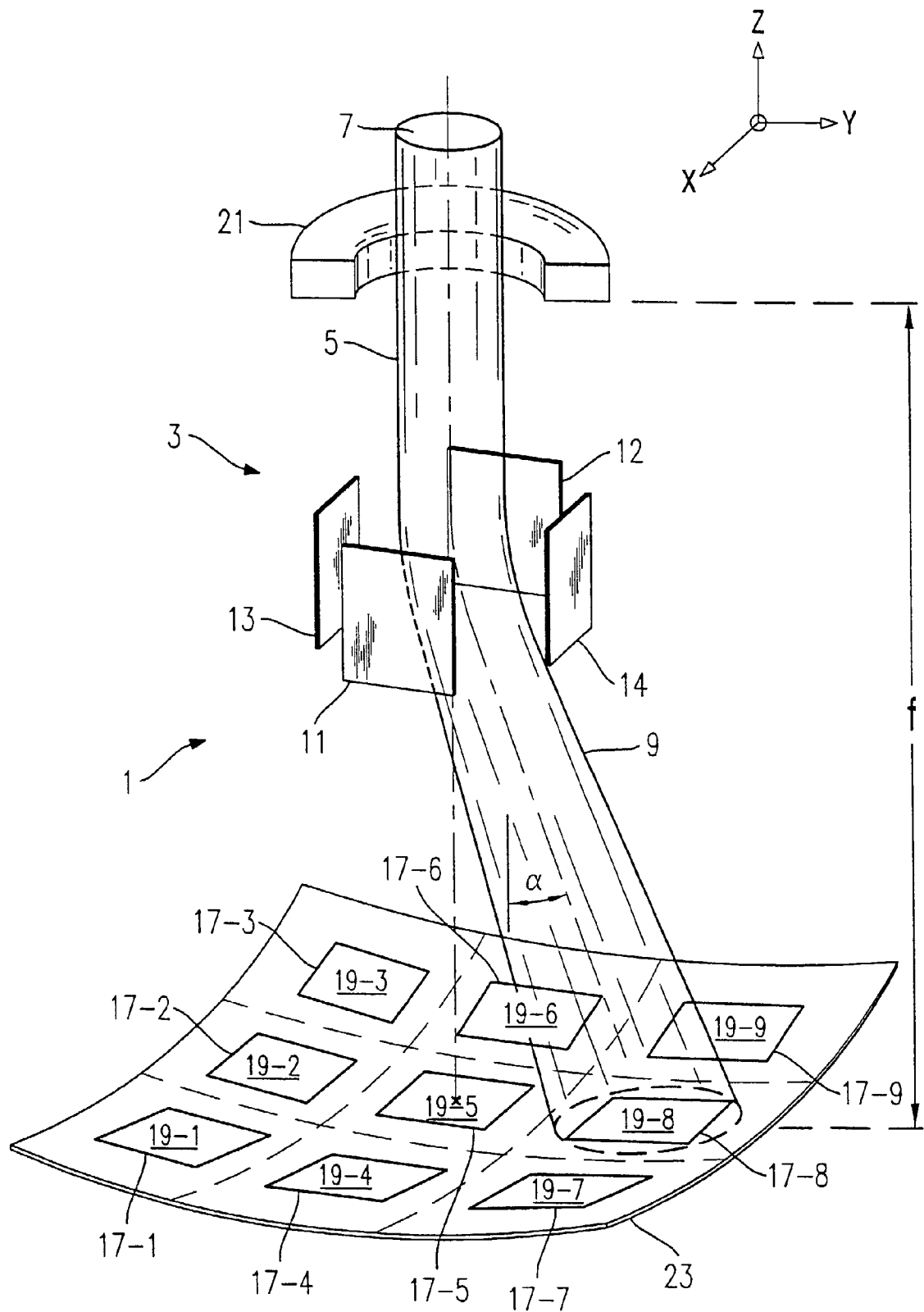
FIG. 1 is a schematic view of a first embodiment of a detector apparatus according to the invention.

FIG. 1 is a perspective schematic view of an exemplary detector apparatus 1 (also referred to herein as a detector arrangement) according to the present invention. The detector arrangement 1 comprises a deflector 3 for charged particles, such as electrons, which enter the deflector 3 as beam 5 with a fixed beam cross-section 7 parallel to a z-axis and emerge from the same as deflected beam 9. The deflector 3 is an electro-static deflector and comprises two electrodes 11 and 12 which are oppositely disposed in an x-direction in respect of the incident beam as well as two electrodes 13 and 14 which are oppositely disposed in a y-direction in respect of the incident beam 5. The pairs of electrodes 11, 12 and 13, 14 are controllable by a control system (also referred to herein as a controller), not shown in FIG. 1, for producing an electric field between the electrode pairs which deflects the beam 5 orthogonally in respect of the beam direction of the incident beam 5. In the examples of FIG. 1, a voltage of about 0 volt is applied to the pair of electrodes 11 and 12, whereas a voltage is applied to the other pair of electrodes 13 and 14 such that the electric field between the electrodes 13 and 14 deflects the incident beam 5 by an angle α in y-direction.

Nine position-sensitive electron detectors 17 are disposed spaced apart from the deflector 3 in z-direction, the detection areas 19 of said electron detectors being arranged, in projection along the z-axis, in a field wherein adjacent detection areas are spaced apart from one another by an equal distance in x-direction and y-direction.

If the incident beam 5 were not deflected by the deflector 3, it would centrally impinge on the detection area 19-5 of the detector 17-5 which is disposed centrally in the field of detectors. When the beam 5 is deflected by the angle α as shown in FIG. 1, the beam 9 emerging from the deflector 3 impinges centrally on the detection area 19-8 of the detector 17-8 disposed adjacent to the central detector 17-5 in y-direction. The deflector 3 is controllable such that the incident beam 5 is deflectable such that it can selectably be directed to any one of the detection areas 19 of the nine detectors 17.

Each one of the detectors 17 is provided to integrate position-dependently the intensity of charged particles impinging on its detection area 19 during an exposure time $t_B$ of the detector 17. Accordingly, each detector 17 serves to detect position information contained in the incident beam 5. In order to detect such position information with a maximum contrast, a magnetic lens 21 is disposed in the beam path in front of the deflector 3 which has a focusing effect on the incident beam 5. In this example, it is assumed that the incident beam 5 is a parallel beam emanating from infinity, and a distance between the magnetic lens 21 and the field of detectors 17 is dimensioned such that it is substantially equal to a focal width f of the magnetic lens 21. Moreover, the planar detector areas 19-3 are substantially disposed on an image area having the shape of a spherical cup 23, the center of the sphere being disposed in the center of the magnetic lens 21. Accordingly, a substantially sharp image of the position information contained in the beam 5 is formed on each detection area 19 when the deflector 3 directs the beam 9 to the same.

In the example of FIG. 1, the detectors 17 are each CCD-type semiconductor detectors, with a scintillator being disposed in front of the sensitive area thereof for converting the impinging charged particles into photons which, in turn, excite the semiconductor detectors.

Figure 2:
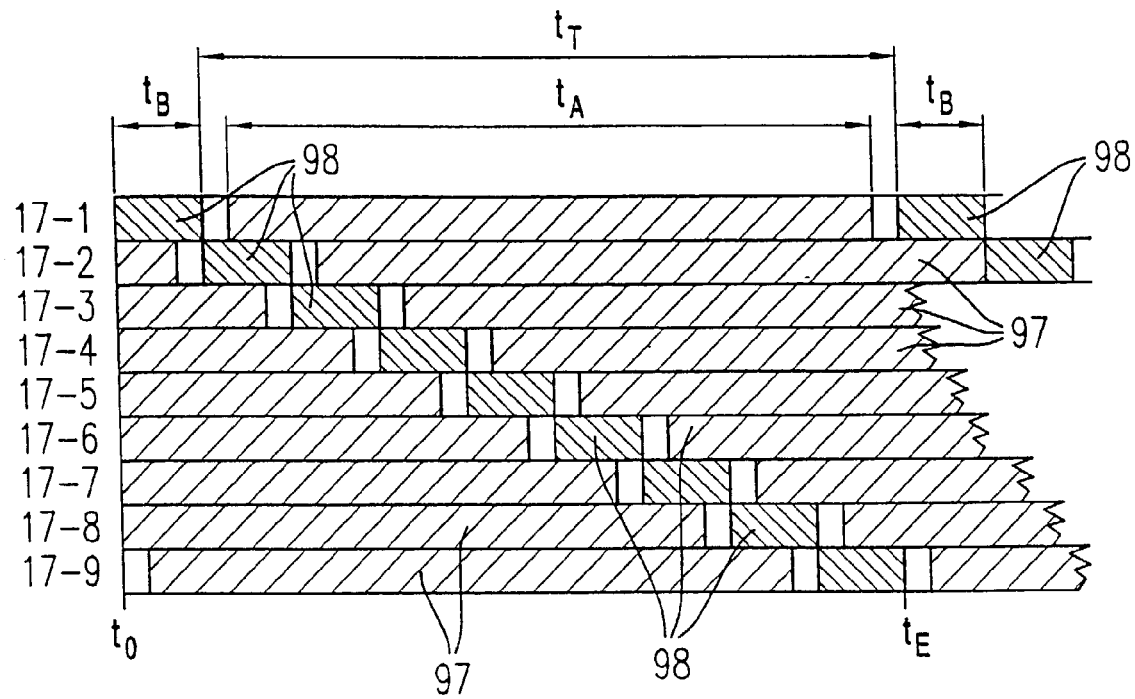
FIG. 2 shows a time scheme for controlling detectors of the detector apparatus shown in FIG. 1.

An exemplary control scheme for the detectors 17 is shown in FIG. 2. In order to be able to integrate an image in the detector 17 with sufficient contrast, at a given application and intensity of the beam, an exposure time $t_B$ is provided. After the exposure time has elapsed, the position-dependent image which has accumulated in the detector 17 is transmitted to the controller. This requires a transmission time 97 referred to as $t_A$. After the image has been transmitted to the controller in the form of analogue or digital electronic signals, the detector is reset and can then be exposed again. Therefore, a data transmission starts, the data transmission itself takes place, and the detector is reset during a dead time referred to as $t_T$ between a previous exposure time $t_B$ and a subsequent exposure time $t_B$. During this dead time $t_T$, the detector cannot integrate any further electron intensity and is thus in a dead time state.

In the exemplary time scheme shown in FIG. 2, the dead time $t_T$ is considerably longer than the exposure time $t_B$.

At the beginning $t_0$ of the control cycle, the deflector can be controlled such that the beam is directed to the detection area 19-1 of the detector 17-1. During the exposure time $t_B$ of this detector 17-1, designated by reference number 98 in FIG. 2, the beam 9 remains to be directed to this detector and the intensity of charged particles in the beam 9 is position-dependently integrated by the detector 17-1. After the exposure time $t_B$ of the detector 17-1 has elapsed, the controller controls the deflector 3 such that the detector selected for being exposed by the beam is changed from the previously exposed detector 17-1 to the detector 17-2 now exposed (a newly selected detector). The change of the selected detector is effected by the deflector 3 substantially instantaneously, the detector 17-2 having already been previously reset so that its exposure can start substantially immediately as soon as the beam is directed to the detection area thereof. After the exposure time $t_B$ of the detector 17-2 has elapsed, the selection of the exposed detector is again changed, and the deflector 3 then directs the beam to the next, previously reset detector 17-3, the exposure of which is then started. This procedure is continued so that at a point in time $t_E$ all detectors 17-1 to 17-9 have been exposed successively in time. The point in time $t_E$ coincides with the end of the dead time $t_T$ of the first detector 17-1. This means that at the point in time $t_E$ the detector 17-1 is ready again to be exposed again. Accordingly, after the exposure time $t_B$ of the detector 17-9 has elapsed, the deflector 3 is controlled at the point in time $t_E$ such that it does not direct the beam to the detector 17-8 last exposed, but again to the detector 17-1 which is exposed as from that point in time. Thus, the imaging of a region of an object with a newly selected detector and the corresponding integrating of intensity with the newly selected detector can occur during the transmission of an image from a previously selected detector to the memory area of the memory. The same is true for the other exemplary embodiments described herein.

This exemplary control scheme for the nine detectors 17 shown in FIG. 2 thus enables, despite the relatively long dead time $t_T$ of the detectors as compared to the exposure time $t_B$, to obtain substantially constantly image information from the beam 5.

The beam 5 is thus directed successively in time to the various detection areas of the detectors, and the detectors 17 are successively in their exposure state. Accordingly, in the exemplary scheme of FIG. 2, the transmission times $t_A$ of the individual detectors 17 are also shifted in time relative to one another.

The image data transmitted during the periods of time $t_A$ are transmitted by the controller to a memory. In the memory, the images of the individual detectors are stored in different memory areas, the memory areas and the respective detectors being allocated to each other so that the individual images obtained from the detectors can later be analyzed.

Variants of the above-described exemplary embodiment will now be described. Components which correspond in function and structure to components of embodiments described with reference to FIGS. 1 and 2 are designated by the same reference numbers as in FIGS. 1 and 2. For the purpose of distinction, however, such reference numbers are supplemented by an additional letter.

Figure 3:
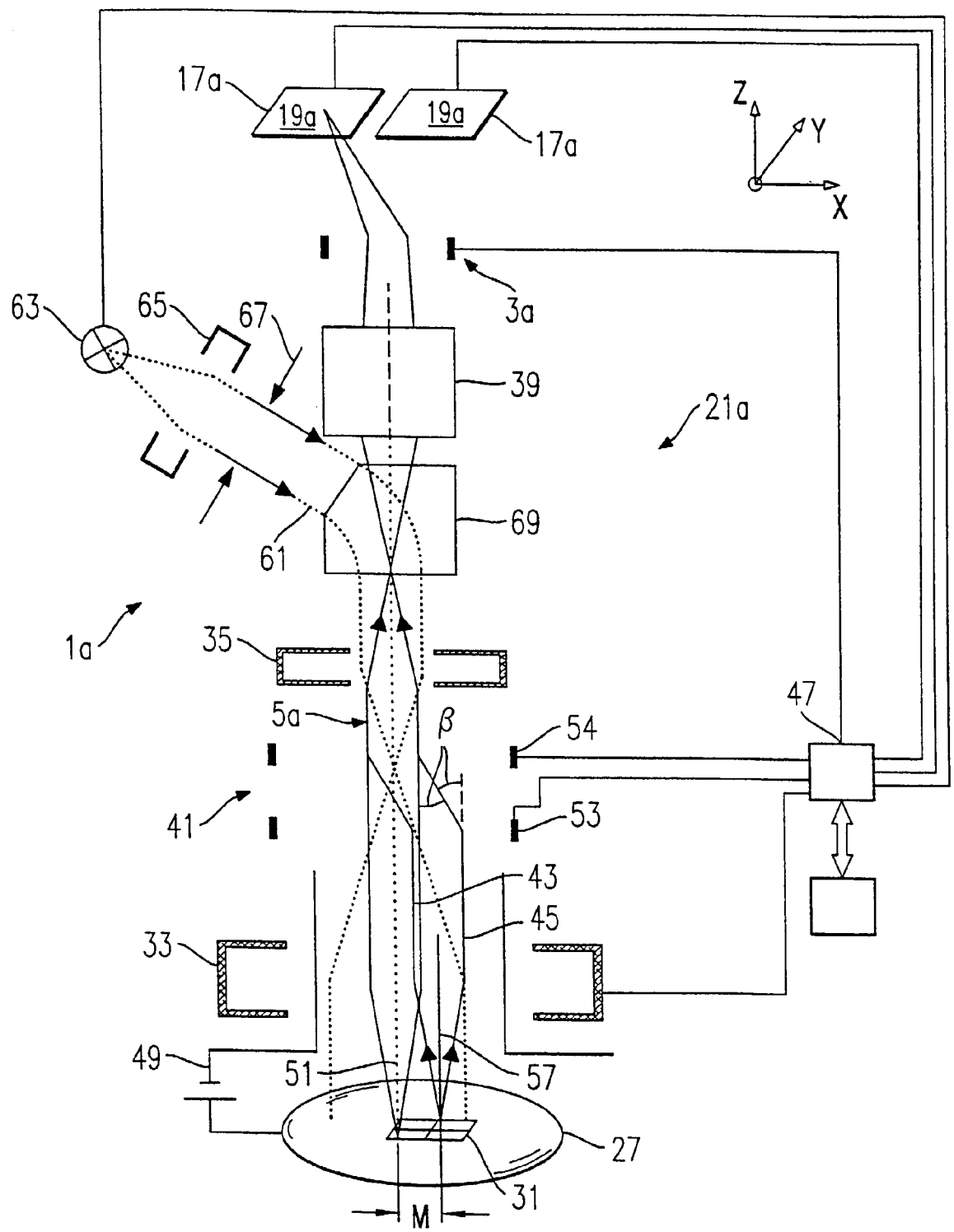
FIG. 3 is a schematic view of a second embodiment of a detector apparatus according to the invention for use with secondary electron microscope.

Another exemplary detector arrangement 1a schematically shown in FIG. 3 serves to form an image of spatial structures of an object 27, such as a semiconductor wafer 27 in its manufacturing process. The image of the spatial structures of the object 27 is an electronic image, the image data of which are stored in a memory 29.

The exemplary detector arrangement 1a can be provided for use with secondary electron microscope comprising an optical imaging system 21a to image a two-dimensionally limited field 31 of the surface of the object 27 on a detection area 19a of a detector 17a of a plurality of detectors 17a. To this end, the optical imaging system 21a comprises a focusing lens 33 disposed close to the object, a further focusing lens 35, a further optical magnification system 39 and a deflector 41.

In FIG. 3, trajectories of two secondary electrons 43 and 45 emerging from a position of the field 31 at different angles are symbolically represented. The secondary electrons emerging from the object 27 with a kinetic energy of from 0 eV to about 50 eV are at first accelerated to a kinetic energy of about 20 keV. The acceleration is effected by an electric field which is provided between the object 27 and an electrode 49 disposed in front of the object. After having been accelerated, the electrons pass through the focusing lens 33 disposed close to the object and the further focusing lens 35. After having passed through the focusing lens 35, a beam 5a of secondary electrons 43 and 45 contains position information about the object 27, because the intensity with which the secondary electrons 43 and 45 are emitted from the sample 27 is position-dependent due to the structures of the object 27 within the field 31. In order to obtain this position information in the form of an image, the beam passes through the further optical magnification system 39 which may comprise one or more further electron-optical lenses and other components. After having passed through the further optical magnification system 39, the beam 5a passes through a deflector 3a which is controllable by a controller 47 such that the beam impinges on the detection area 19a of a detector selected from the plurality of detectors 17a by the controller 47.

In FIG. 3 two detectors 17a are symbolically represented. However, three or more detectors can be provided, for example, nine detectors in an arrangement as shown in FIG. 1. What is decisive is that the controller 47 selects one of the detectors to which the beam 5a is then directed by the deflector 3a in order to expose the selected detector. To this end, an exposure scheme is likewise used which corresponds to the exposure scheme described with reference to FIG. 2. That means, the different detectors 17a are exposed successively in time, and the intensity images stored in each detector are transmitted to the controller 47 during a dead time of the respective detector. However, during the dead time of each detector 17a, other detectors 17a are available for exposure and thus for the obtainment of the position-dependent information contained in the beam 5a, so that a substantially uninterrupted obtainment of the position information is possible.

The images transmitted by the individual detectors 17a to the controller 47 are stored by the controller 47 in the memory 29 in respective different memory areas.

The components 33, 35 and 39 of the optical imaging system 21a are substantially centered in respect of a main axis 51 of the detector arrangement 1a. However, the field 31 which is imaged on one of the detection areas 19a is displaceable in respect of the main axis 51 in an x-direction transverse to the main axis 51. To this end, two deflectors 53 and 54 are disposed between the two focusing lenses 33 and

35. FIG. 3 shows an exemplary situation in which the center of the field 31 imaged on the detection area 19a is displaced from the main axis 51 in x-direction by a distance M. After having traversed the focusing lens 33 disposed close to the object, the trajectories 43 and 45 extend substantially parallel to the z-axis or main axis 51. The deflector 53 disposed closer to the object causes the trajectories to be deflected through an angle β such that the electrons travel towards the main axis 51. Subsequently, the deflector 54 disposed more remotely from the object 27 causes the electrons to be deflected through an angle −β such that the electrons travel again parallel to the z-axis. The deflection M of the field 31 away from the main axis 51 is thus determined by the distance which the two deflectors 53 and 54 are spaced apart from each other and the deflection angles β respectively provided by the two deflectors 53 and 54.

The focusing lens 33 disposed close to the object is controllable by the controller 47 such that an optical axis 57 of the lens, effectively provided for the secondary electrons 43 and 45, is displaced away from the geometric main axis 51 of the detector arrangement in x-direction by the amount M. Accordingly, the focusing lens 33 disposed close to the object can be a lens with a variable optical axis or a variable axis lens which is also referred to as moving object lens (MOL). Such a lens is, for example, known from U.S. Pat. No. 4,376,249 or from the article by E. Goto et al., OPTIC 48 (1977), pages 255 et seq.

The focusing lens 33 disposed close to the focusing lens and the deflectors 53 and 54 thus return the field 31, which has been deflected from the main axis 51 by the amount M, to the main axis 51, with an imaging characteristic being maintained, so that the beam 5a traversing the second focusing lens 35 centrally with respect to the main axis 51 carries the position information of the field 31 displaced away from the main axis by the amount M.

An exemplary operation of the examination system illustrated in FIG. 3 is as follows. In a first step, a first field 31 of the wafer 27 is imaged on a first one of the detectors 17a, and said first detector 17a is exposed with the secondary electrons emerging from the first field 31 of the object 27 during an exposure time $t_B$. After the exposure time $t_B$ of the first detector 17a has elapsed, the deflector 3a is controlled by the controller 47 to direct the beam 5a to a second detector 17a which is currently not in a dead time state. Simultaneously with the switch-over of the exposed detector 17a, the deflectors 53 and 54 as well as the focusing lens 33 disposed close to the object are controlled by the controller 47 to image a second field of the wafer 27 disposed adjacent to the first imaged field by means of the optical imaging system 21a. Accordingly, the image of the second field on the surface of the object 27 is formed in the second detector 17a. This procedure is repeated with further detectors 17a and further fields 31 until all detectors 17a have been exposed. At such point in time, however, the dead time of the first detector 17a has elapsed so that this detector is available again for exposure. Accordingly, the deflector 3a is controlled by the controller 47 to direct the beam 5a again to the first detector. This switch-over of the deflector 3a is again conducted at the same time the deflectors 53 and 54 and the focusing lens 33 disposed close to the object are switched-over such that a further field 31 of the object surface 27 which is different from the previously imaged fields is again imaged by the optical system 21a.

Each image of a part of the object surface thus detected by the detectors 17a is transmitted to the controller 47 according to a scheme described, for example, with reference to FIG. 2 and supplied by the same to the memory 29, each image being stored in a separate partial region of the memory. Accordingly, after termination of the examination of the object 27, all images obtained from the same are contained in digital form in the memory 29 and can be subjected to a subsequent analysis.

The secondary electrons 43 and 45 are extracted from the object 27 by a primary electron beam 61 which is shaped by an electron gun 63, a magnetic lens 65 and a beam-shaping aperture 67. The kinetic energy of the primary electrons of the beam 61 can be about 22 keV. The primary electron beam 61 is superposed to the secondary electron beam 5a on the main axis by means of a beam combiner, for example, a Wien filter 69. Accordingly, the primary electron beam 61 travels on the main axis 51 towards the object 27 and, in so doing, successively traverses the focusing leans 35, the deflectors 54 and 53 and the focusing lens 33 disposed close to the object. During its travel, the primary electron beam is also subjected to a certain deflection by the deflectors 54 and 53. However, the respective deflection angles need not necessarily correspond to the deflection angles β and −β of the secondary electrons. Accordingly, the beam-shaping aperture 67 is dimensioned such that a part of the object surface of the object 27 is illuminated with primary electrons, which part is larger than the field 31 which is imaged on the detectors 17a.

The controller 47 is also capable of controlling the electron gun 63 to adjust the intensity of the primary electron beam 61. As a result, it is possible, with a given illumination time $t_B$ of the detectors, to set an optimal illumination intensity. Moreover, it is possible for the controller 47 to control the electron gun 63 such that the latter supplies pulses of primary electrons, so that the secondary electrons are likewise generated in pulsed manner. This allows realization of particularly short exposure times and observation of changes in the structure of the object 27 which occur during time intervals which are shorter than the exposure times $t_B$ of the detectors 17a.

Figure 4:
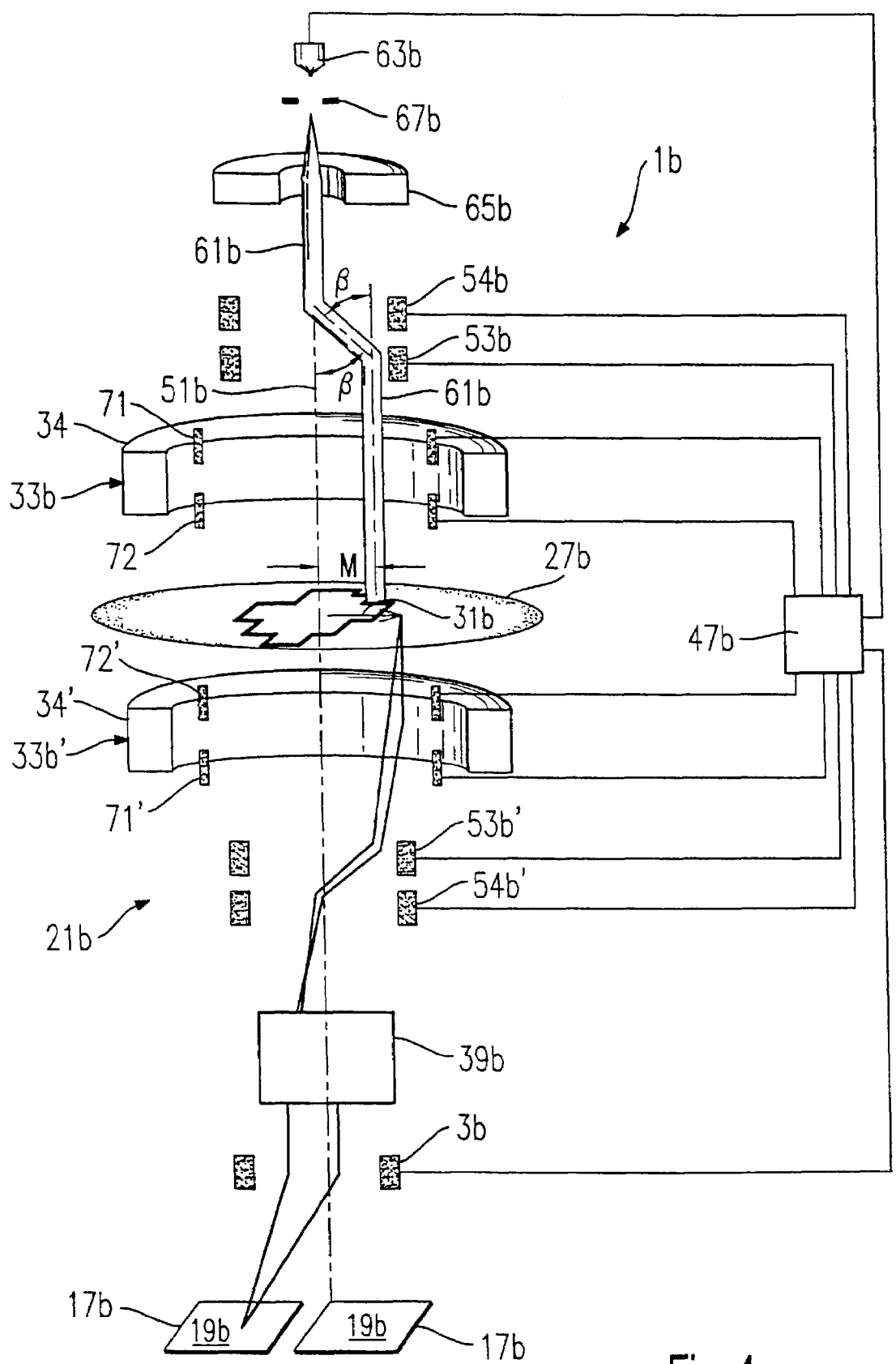
FIG. 4 is a schematic view of a third embodiment of a detector apparatus according to the invention for use with a transmission electron microscope.

FIG. 4 illustrates another exemplary embodiment of the present invention, in which a detector arrangement 1b can be provided for use with a transmission electron microscope. A primary electron beam 61b is shaped by an electron gun 63b, a beam-shaping aperture 67b and a focusing leans 65b, and travels at first along a main axis 51b of the apparatus. The primary electron beam 61b then passes successively through two beam deflectors 54b and 53b which successively deflect the beam through an angle β and −β, respectively, so that the beam, after having passed through the deflector 53b, enters a focusing lens 33b displaced in respect of the main axis 51b by an amount M. The focusing lens 33b comprises a magnetic round lens 34 and, disposed therein, coils 71 and 72 for producing a magnetic dipole field which can be superposed to the focusing field of the round lens 34 such that, as a whole, a focusing field is obtained for the primary electron beam 61b which is deflected from the main axis 51b by the amount M. The axis of symmetry of this field is likewise deflected in respect of the main axis 51b by an amount M. Accordingly, the primary electrons 61b illuminate a field on a sample 27b which is likewise deflected from the main axis 51b by the amount M.

The primary electrons impinging on the upper side of the object 27b in the illuminated field 31b pass only partially through the object 27b and emerge from the other side as transmission electrons. The emerging transmission electrons are imaged on detection areas 19b of a plurality of detectors 17b by means of an optical imaging system 21b. The optical imaging system 21b includes components which are disposed substantially symmetrically, in respect of the surface of the object 27*b*, with the components which direct the primary electron beam 61*b* to the field 31*b*. Accordingly, the optical imaging system 21*b* also comprises a focusing lens 33*b*' with a magnetic round lens 34*b*' in which dipole coils 72' and 71' are disposed and, furthermore, two deflectors 53*b*' and 54*b*'. The components 71', 72', 53*b*' and 54*b*' of the optical imaging system 21*b* are also controllable by the controller 47*b* such that the field 31*b* deflected from the main axis 51*b* by the amount M is returned to the main axis 51 before the transmission electrons enter a further optical magnification system 39*b*. After having passed through the further optical magnification system 39*b*, the transmission electrons traverse a deflector 3*b* which deflects the beam of primary electrons from the main axis 51*b* such that it selectively impinges on one of the detectors 17*b* which are disposed spaced apart from the object 27*b* by such a distance that the surface thereof is sharply imaged on the detectors.

In the exemplary embodiment shown in FIG. 4, the detectors 17*b* can also be operated according to a time scheme as described with reference to the embodiment illustrated in FIG. 3 and FIG. 2, respectively. This transmission electron microscope allows recording a complete electron-microscopical image of a relatively large part of the surface of an object within relatively short time.

Figure 5:
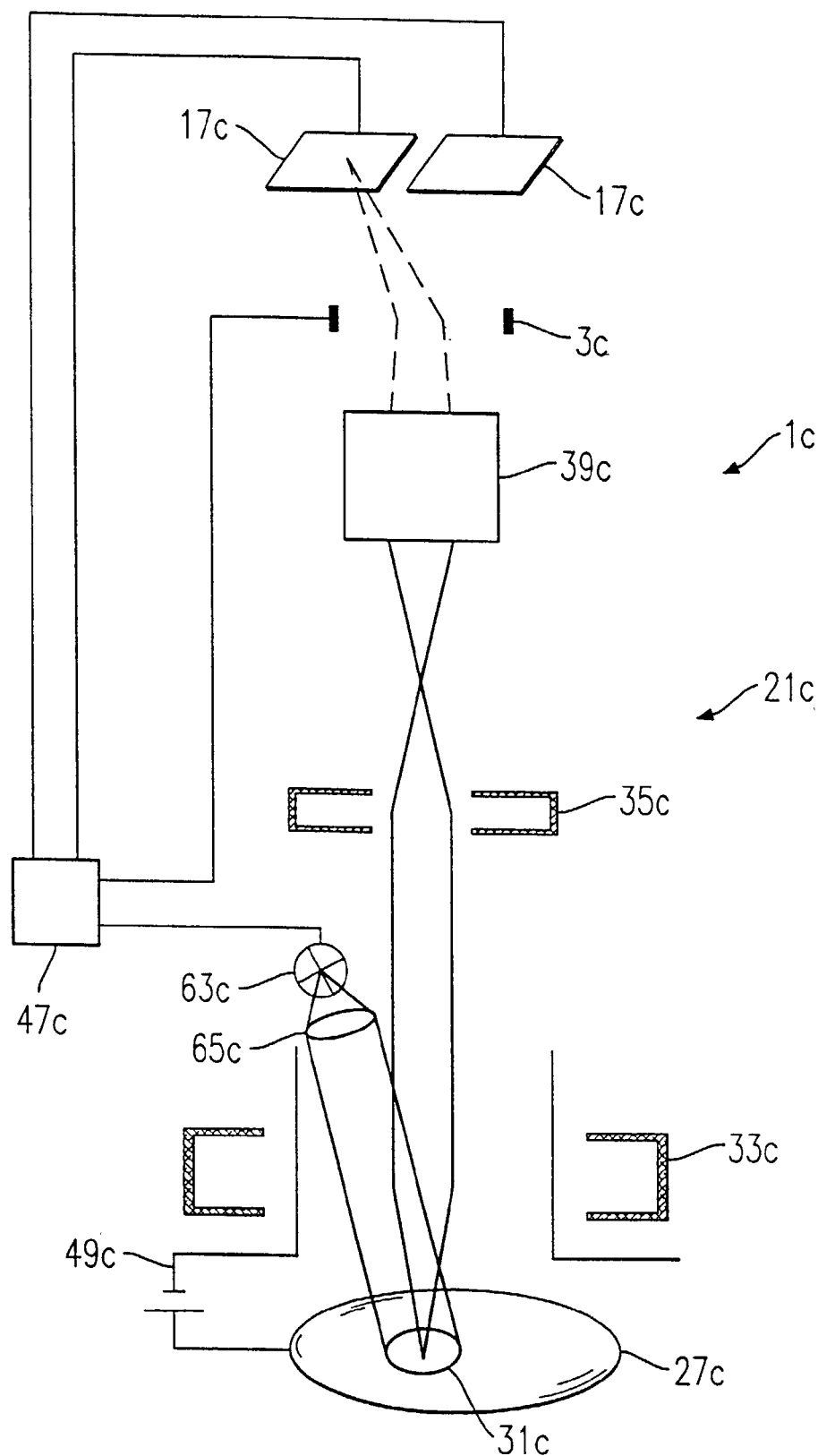
FIG. 5 is a schematic view of a fourth embodiment of a detector apparatus according to the invention for use with a photoelectron microscope.

FIG. 5 shows another exemplary detector arrangement 1*c*, which can be provided for use with a photoemission electron microscope. It comprises a light or photon source 63*c* which is controlled by a controller 47*c* in pulsed fashion and illuminates a field 31*c* of a sample 27*c*. Photoelectrons are extracted from the sample 27*c* in the field 31*c* by the photons of the photon source 63*c*, which photoelectrons are accelerated by means of an electrode 49*c* to which a corresponding potential in respect of the sample 27*c* is applied and pass through a focusing lens 33*c* disposed close to the object. Subsequently, the photoelectrons pass through a second focusing lens 35*c* and then through a further optical magnification system 39*c*. The focusing lens 33*c* disposed close to the object, the second focusing lens 35*c* and the further optical magnification system 39*c* together act as an optical imaging system 21*c* to image the field 31*c* of the object 27*c* on detectors 17*c*. Between the further optical system 39*c* and the detectors 17*c*, there is disposed a deflector 3*c* which is controlled by the controller 47*c* such that the field 31*c* is selectively imaged on one of the detectors 17*c*.

In contrast to the embodiments described with reference to FIGS. 3 and 4, in the electron microscope of FIG. 5, the region 31*c* of the object 27*c* imaged on the detectors 17*c* is not deflectable in respect of a main axis of the apparatus. The microscope 1*c* primarily serves to detect rapidly variable structure changes of the object 27*c*. To this end, the controller 47*c* controls the photon source 63*c* and the deflector 3*c* in a synchronized sequence. The deflector 3*c* is controlled whenever exactly one radiation pulse has been produced by the photon source 63 to direct the field 31*c* to a further detector which differs from the previously exposed detector. As a result, images of the object 27*c* are produced successively in time in the different detectors 17*c*. The images are then successively read out from the different detectors also in a time sequence according to a scheme which corresponds about to that described with reference to FIG. 2. Therefore, the detector arrangement 1*c* allows a higher rate of images of the rapidly varying structure changes of the object 27*c* to be taken as it would be possible with a conventional arrangement which comprises merely a single detector.

In a variation of the embodiment relating to a photoelectron microscope described above with reference to FIG. 5, the source 63*c* could also be an ion source and the optical system 65*c* could be ion optics for supplying energy to the region 31*c* on the sample 27*c*. This energy supplied in the form of ions then results into a position-dependent emission of electrons in the region 31*c* of the sample 27*c* which is observed by means of the optical system 21*c* and the detectors 17*c*.

Figure 6:
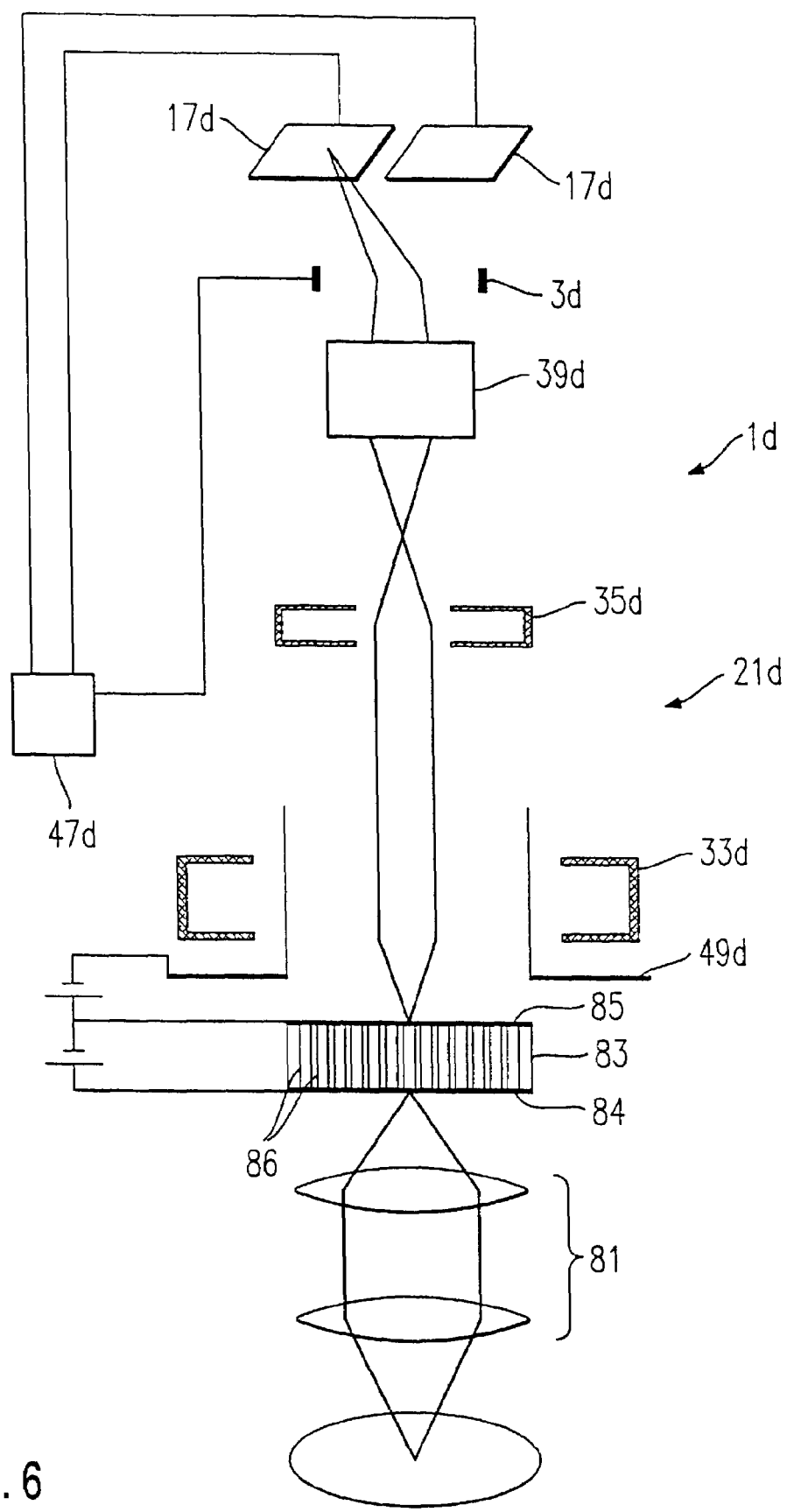
FIG. 6 shows a further embodiment of a detector apparatus.

FIG. 6 illustrates another exemplary detector arrangement 1*d* according to the present invention. In contrast to the systems described with reference to FIGS. 3, 4 and 5, in a detector arrangement 1*d* shown in FIG. 6, an object 27*d* is not examined directly electron-optically. Rather, the object 27*d* is imaged light-optically on an entrance side 84 of a photon/electron converter 83 by means of a light-optical system 81. In the example of FIG. 6, the photon/electron converter 83 provided as a multi-channel plate so that a plurality of micro-tubes 86 extend between an entrance side 84 and an exit side 85 of the plate. Between the entrance side 84 and the exit side 85, there is applied a high electric voltage, as a result of which photoelectrons which are produced at the entrance side 84 are multiplied in the micro-tubes 86 and exit at the exit side 85 from the tubes 86. The electrons exiting from the exit side 85 of the photon/electron converter 83 are first accelerated by means of an electrode 49*d* an imaged on detectors 17*d* by means of an optical imaging system 21*d* which comprises two focusing lenses 33*d* and 35*d* as well as a further optical magnification system 39*d*. Between the further optical magnification system 39*d* and the detectors 17*d*, there is again disposed a deflector 3*d* for selectively imaging the exit side 85 of the converter 83 on a detector 17*d* of the plurality of detectors. The electrons are imaged on the individual detectors, and the detectors 17*d* are read out into the control 47*d* again in a time sequence which corresponds to that described above. In contrast to an optical observation of the object in accordance with a conventional method wherein the object is optically imaged directly on an optical detector, the electron detector arrangement 1*d* allows a considerably higher pick-up rate of the images taken. Due to the electron-optical deflector 3*d* being interposed, it is possible to switch very quickly between several detectors to be exposed, so that the increased number of detectors 17*d* provided and successively exposed enables an effective increase of the image pick-up rate.

For the purpose of simplification, FIGS. 3, 4, 5 and 6 merely show two detectors as the plurality of detectors. However, the number of detectors in these embodiments is provided such that, after the exposure time of each one of the detectors has elapsed, a further detector is available which is currently not in its dead time state. Accordingly, the number of the detectors actually used in these embodiments will be higher. The arrangement of this plurality of detectors can either be in a row, that is, linearly side by side, as it is intimated in FIGS. 3 to 6. The deflector is then provided to merely deflect the beam in a single direction transverse to the beam direction. However, it is also possible to arrange the detectors in a two-dimensional field, such as shown in FIG. 1. Accordingly, the deflector can then be provided for deflecting the beam in two directions independent from each other and perpendicular to the beam axis. The plurality of detectors can be disposed in a field side by side in several directions.

The deflector included in the above-described embodiments for directing the beam selectively to one of the detectors of the plurality of detectors has been described as electro-static deflector. However, it is also possible to provide a magnetic deflector for this purpose, that is, a coil arrangement which produces a magnetic field having a deflecting effect on the beam of charged particles. Preferably, this is a magnetic dipole field.

Figure 7:
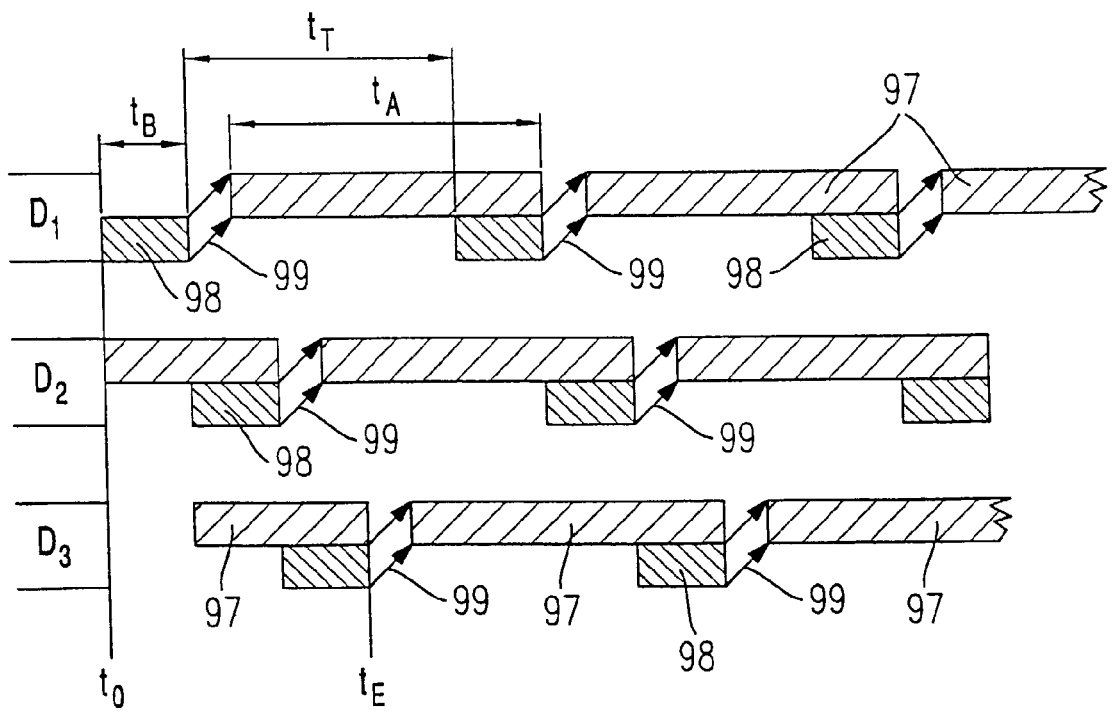
FIG. 7 shows a variant of the control scheme shown in FIG. 2 for detectors.

FIG. 7 shows a variant of the exemplary control scheme for detectors of FIG. 2. The control scheme shown in FIG. 7 relates to detectors which comprise an intermediate memory. FIG. 7 shows the control scheme for three detectors $D_1$, $D_2$ and $D_3$. At the beginning of the scheme, at a point in time $t_0$, the detector $D_1$ is exposed during an exposure time $t_B$. After the exposure time has elapsed, the image integrated by the detector $D_1$ is transferred to the intermediate memory of the detector $D_1$, as shown by arrows 99 in FIG. 7. After the previously taken image has been transferred into the intermediate memory, the image is transmitted from the intermediate memory to the controller which requires a read-out time $t_A$. However, the detector is already ready again for a new exposure before the transmission of the image from the intermediate memory to the controller has been terminated. In the depicted control scheme, detector $D_2$ is exposed directly after the detector $D_1$ has been exposed and, after the exposure time of said detector has elapsed, the detector $D_3$ is exposed, the exposure time of which terminates at the point in time $t_E$. Subsequently, the detector $D_1$ is again exposed. However, the detector $D_1$ is again exposed at a point in time when the transmission of the previously exposed image from the intermediate memory to the controller has not yet been concluded. All in all, the exposure of the detectors $D_1$, $D_2$, $D_3$ is performed substantially uninterrupted so that the position information contained in the beam of charged particles is substantially constantly detected. Due to the intermediate memory in the detector, the image information can be read out from the detector at the same time the detector is exposed, and a dead time $t_T$ of the detector is shorter than the time $t_A$ required for reading out an image.

The detectors employable in the above-described embodiments can be, for example, conventional CCD (charged coupled device) detectors. However, it is also possible to use other types of detectors for this purpose. For example, CMOS active pixel detectors or random access charge injection device detectors can be used. A CMOS active pixel detector can be obtained, for example, under the trade name PB-MV 40 by the company Photobit. A random access charge injection device detector can be obtained, for example, under trade name RACID 84 by CIDTECH.

Moreover, it is possible to use the plurality of detectors described with reference to the above-described embodiments to check the operatability of each detector. To this end, one and the same region of the object is covered on two or more detectors successively in time. Identical partial images should be produced in the two or more detectors. By comparing these partial images obtained by the two or more detectors, differences in the partial images can be determined from which it is possible to conclude a defect of a detector. This process thus allows to identify defective bit areas, such as pixel errors, in each one of the plurality of detectors. This process for determining a defect in the detectors can, for example, be regularly or irregularly repeated.

In the above-described embodiments, the deflector is disposed between the detectors and the further optical magnification system according to FIGS. 3, 4, 5 and 6 and the magnetic lens 21 according to FIG. 1, respectively. However, it is also possible to dispose the deflector in the beam path in front of one or more components of the further optical magnification system or the entire optical imaging system or to integrate the deflector into the optical imaging system. Correction components, such as dynamic focusing coils, can also be provided in order to compensate for the aberrations produced by the deflector.

The embodiments described herein are merely illustrative and should not be considered restrictive in any way. The scope of the invention is given by the appended claims, rather than the preceding description, and all variations and equivalents which fall within the range of the claims are intended to be embraced therein.

What is claimed is:

1. An apparatus for detecting position information contained in a beam of charged particles, comprising:
   a plurality of detectors, each detector being a position-sensitive detector having a detection area that is two-dimensional, each detector supplying an image containing position information of a position-dependent distribution of intensity, integrated in terms of time, of charged particles impinging on a detection area of said detector;
   an optical imaging system for imaging an object disposable in an object plane of the optical imaging system, or for imaging an intermediate image of an object, by means of the beam of charged particles, wherein the optical imaging system is configured to image at least a partial region of an object on the detection area of a given one of said detectors, wherein the partial region of the object is two-dimensional such that the two-dimensional partial region of the object is imaged on the two-dimensional detection area of to given detector;
   an illumination system for supplying energy to an entire two-dimensional area of the partial region of the object simultaneously such that the charged particles emanate from positions in the partial region and are directed through the optical imaging system to the detection area of the given detector;
   a control system configured to receive images supplied by the detectors; and
   a deflector configured to direct the beam of charged particles to a detection area of a first detector selectable from the plurality of detectors, the deflector being controllable by the control system to select the first detector from the plurality of detectors to which the beam of charged particles is to be directed,
   wherein the first detector does not integrate intensity of charged particles impinging on its detection area during the dead time ($t_T$), and wherein the deflector is controllable by the control system to direct, during the dead time ($t_T$), the beam of charged particle to a detection area of a second detector of the plurality of detectors, which is different from the first detector, and wherein imaging and integrating associated with the second detector both occur during transmission of a first image from the first detector to a memory.

2. The apparatus according to claim 1, wherein the control system is configured to control the deflector such that the beam is directed successively in time and recurrently, in a periodic fashion, to the detection areas of the plurality of detectors.

3. The apparatus according to claim 2, wherein each one of the detectors has an associated exposure time ($t_B$) during which a respective detector integrates intensity of the charged particles impinging on its detection area, and wherein a number of the detectors is determined as a ratio of the dead time ($t_T$) divided by the exposure time ($t_B$) rounded up to a next higher whole number.

4. The apparatus according to claim 1, wherein the optical imaging system is controllable by the control system to change the partial region of the object imaged on the detection area of the given detector.

5. The apparatus according to claim 4, wherein the control system is configured to change the imaged partial region of the object substantially simultaneously with selecting a different detector for imaging.

6. The apparatus according to claim 1, wherein the illumination system comprises at least one of an electron source, a photon source, and an ion source.

7. The apparatus according to claim 1, wherein the charged particles comprise at least one of backscattering electrons, secondary electrons, transmission electrons, and photoelectrons.

8. The apparatus according to claim 1, wherein the illumination system is a pulsed illumination system controllable by the control system, and wherein the control system is configured to control the illumination system to emit an energy pulse after a change in selection of a given detector on which the partial region is imaged has occurred and, subsequently, to select another detector on which the partial region is imaged.

9. The apparatus according to claim 1, wherein the object is a photon-electron converter.

10. The apparatus according to claim 1, wherein the detection areas of the plurality of detectors are substantially disposed in an image area of the optical imaging system.

11. The apparatus according to claim 1, wherein the beam of charged particles is deflectable by the deflector into a single deflection direction transverse to a beam direction of the beam of charged particles, and the detection areas of the plurality of detectors are disposed in a row side by side.

12. The apparatus according to claim 1, wherein the beam of charged particles is deflectable into two directions (x, y) oriented transversely to each other and to a beam direction (z) of the beam of charged particles, and the detection areas of the plurality of detectors are disposed in a field side by side in at least two directions.

13. The apparatus according to claim 1 wherein the detectors are at least one of CCD detectors and CID detectors.

14. A method for forming an image of an object to be observed, comprising:
providing a plurality of detectors, each detector being a position sensitive detector having a detection area that is two-dimensional and each detector being provided for integrating, in terms of time, a position-dependent intensity of a beam of charged particles impinging on a detection area of the detector during exposure times of the detector, and for supplying an image of the integrated position-dependent intensity, each image comprising multiple pixels of information, each detector having a dead time state during at least a part of a time required for supplying a respective image, during which dead time a respective detector does not integrate intensity of the beam of charged particles;
providing a memory for receiving a plurality of images supplied by the detectors;
imaging at least a two-dimensional partial region of the object on a two-dimensional detection area of a currently selected one of the plurality of detectors using the beam of charged particles and integrating the position-dependent intensity of the beam of charged particles using the currently selected detector;
determining a detector of the plurality of detectors to be a newly selected detector which is different from the currently selected detector;
transmitting a first image comprising multiple pixels of information from the previously selected detector to a memory area of the memory after the exposure time of the previously selected detector has elapsed;
imaging said at least a two-dimensional partial region of the object or a different two-dimensional partial region of the object on a two-dimensional detection area of the newly selected detector using the beam of charged particles and integrating the position-dependent intensity of the beam of charged particles using the newly selected detector, the imaging and integrating associated with the newly selected detector both occurring during the transmissior of the image from the previously selected detector to the memory area of the memory; and
after termination of the exposure time of the newly selected detector, transmitting a second image comprising multiple pixels of information from the newly selected detector to another memory area of the memory which is different from the memory area to which the first image from the previously selected detector is transmitted,
wherein in said imaging, energy is supplied to an entire two-dimensional area of the partial region of the object simultaneously such that the charged particles emanate from positions in the partial region, and
wherein the each of the detectors has a dead time ($t_T$) during which it does not integrate intensity of charged particles impinging on its detection area, and wherein the beam of charged particles is deflected to a detection area of one detector during the dead time of another detector, and wherein imaging and integrating associated with said one detector both occur during transmission of an image from said another detector to a memory.

15. The method according to claim 14, wherein, in determining the newly selected detector, the newly selected detector is selected to be one of the plurality of detectors which is not in the dead time state.

16. The method according to claim 14, wherein one partial region of the object which is imaged on the detection area of the currently selected detector is different from another partial region of the object imaged on the detection area of the previously selected detector.

17. The method according to claim 16, wherein images of a plurality of partial regions of the object are transmitted to a plurality of memory areas and are combined and outputted as a full image of the object.

18. The method according to claim 14, further comprising:
providing a pulsed illumination system for supplying energy to the at least a partial region of the object such that the charged particles emanate from positions of the at least a partial region and are imaged using the beam of charged particles,
wherein the emission of energy pulses by the illumination system and the determination of the newly selected detector which is different from the currently selected detector are synchronized in time with each other.

19. The method according to claim 14, wherein the imaged object comprises at least one of a photon-electron converter and a semiconductor wafer having a plurality of devices thereon.

20. The method according to claim 14, wherein a same partial region of the object is imaged on at least two detectors of the plurality of detectors, and the images thus obtained from the at least two detectors are compared with each other to obtain information in respect of a possible defect of at least one of the two detectors.

21. An apparatus for detecting image information associated with a beam of charged particles, comprising:
a plurality of area sensors for providing image signals in response to the beam of charged particles, each area sensor having a detection area that is two-dimensional;
an optical imaging system for imaging an object disposable in an object plane of the optical imaging system, or for imaging an intermediate image of an object, by means of the beam of charged particles, wherein the optical imaging system is configured to image at least a partial region of an object on the detection area of a given one of said area sensors, wherein the partial region of the object is two-dimensional such that the two-dimensional partial region of the object is imaged on the two-dimensional detection area of the given area sensor;
a deflector configured to direct the beam of charged particles from a first area sensor to a second area sensor; and
a control system configured to control the deflector to direct the beam of charged particles from the first area sensor to the second area sensor,
wherein the each of the area sensors has a dead time ($t_T$) during which it does not integrate intensity of charged particles impinging on its detection area, and wherein the beam of charged particles is deflected to a detection area of one detector during the dead time of another detector, and wherein imaging and integrating associated with said one detector both occur during transmission of an image from said another detector to a memory.

22. The apparatus according to claim 21, wherein the area sensors are disposed on a surface having a spherical curvature.

23. The apparatus according to claim 21, wherein each area sensor has an exposure time during which intensity of charged particles is integrated and a dead time during which intensity of charged particles is not integrated, and wherein a number of area sensors is chosen as a ratio of the dead time divided by the exposure time rounded up to a next higher whole number.

24. A method for forming an image of an object to be observed, comprising:
selecting a detector of a plurality of detectors to be a first detector of the plurality of detectors, each detector being a position-sensitive detector having a detection area that is two-dimensional;
imaging at least a two-dimensional partial region of an object on a two-dimensional detection area of the first detector using a beam of charged particles and integrating the position-dependent intensity of the beam of charged particles using the first detector;
transmitting a first image comprising multiple pixels of information from the first detector to a memory;
determining a detector of the plurality of detectors to be a second detector which is different from the first detector;
imaging said at least a two-dimensional partial region of the object or a different two-dimensional partial region of the object on a two-dimensional detection area of the second detector using the beam of charged particles and integrating the position-dependent intensity of the beam of charged particles using the second detector; and after termination of an exposure time of the second detector, transmitting a second image comprising multiple pixels of information from the second detector to another memory area of the memory,
wherein the each of the detectors has a dead time ($t_T$) during which it does not integrate intensity of charged particles impinging on its detection area, wherein the beam of charged particles is deflected to a detection area of the second detector during the dead time of the first detector, and wherein the imaging and integrating associated with the second detector both occur during the transmission of the first image to the memory.

25. The apparatus according to claim 1, wherein the detectors are disposed on a surface having a spherical curvature.

26. The method according to claim 14, wherein the detectors are disposed on a surface having a spherical curvature.

27. The method according to claim 24, wherein the detectors are disposed on a surface having a spherical curvature.

28. The apparatus according to claim 1, wherein the detection areas of the plurality of detectors are spaced apart from one another.

29. The method according to claim 14, wherein the detection areas of the plurality of detectors are spaced apart from one another.

30. The apparatus according to claim 21, wherein each area sensor has a detection area, and wherein the detection areas of the area sensors are spaced apart from one another.

31. The method according to claim 24, wherein the detection areas of the plurality of detectors are spaced apart from one another.

32. The method according to claim 24, wherein each detector has a dead time state during at least a part of a time required for supplying a respective image, during which dead time a respective detector does not integrate intensity of the beam of charged particles.

33. The apparatus according to claim 1, wherein the detection areas of the plurality of detectors are non-overlapping.

34. The method according to claim 14, wherein the detection areas of the plurality of detectors are non-overlapping.

35. The apparatus according to claim 21, wherein each area sensor has a detection area, and wherein the detection areas of the area sensors are non-overlapping.

36. The method according to claim 24, wherein the detection areas of the plurality of detectors are non-overlapping.

37. The apparatus according to claim 24, wherein said imaging comprises:
directing the beam of charged particles through a beam combiner; and
directing the beam of charged particles through an optical lens disposed between the beam combiner and the plurality of detectors.

38. The apparatus according to claim 24, wherein said imaging comprises:
transmitting charged particles through the object such that said beam of charged particles comprises charged particles transmitted trough the object.

39. The apparatus according to claim 24, comprising illuminating at least the two-dimensional partial region of the object with a photon source such that said beam of charged particles emanates from the object as photoelectrons.

40. The apparatus according to claim 24, wherein said imaging comprises:

projecting a light-image onto a photon-electron converter, the photon-electron converter corresponding to the object, such that said beam of charged particles emanates from the photon-electron converter as photoelectrons.

41. An apparatus for detecting position information contained in a beam of charged particles, comprising:

a plurality of detectors, each detector being a position-sensitive detector including a detection area comprising multiple pixels;

an optical imaging system configured to image at least a partial region of an object on the detection area of a given one of said detectors by means of the beam of charged particles, the optical imaging system comprising a beam combiner and an optical lens disposed between the beam combiner and the plurality of detectors;

a deflector configured to direct the beam of charged particles from a first detector of the plurality of detectors to a second detector of the plurality of detectors; and a control system configured to control the deflector to direct the beam of charged particles from the first detector to the second detector, wherein the first detector does not integrate intensity of charged particles impinging on its detection area during a dead time ($t_T$), and wherein the deflector is controllable by the controls stem to direct, during the dead time ($t_T$), the beam of charged particles to a detection area of the second detector of the plurality of detectors, which is different from the first detector, and wherein imaging and integrating associated with the second detector both occur during transmission of a first image from the first detector to a memory.

42. The apparatus according to claim 41, wherein the detection areas of the plurality of detectors are substantially disposed in an image area of the optical imaging system.

43. An apparatus for detecting position information contained in a beam of transmission electrons, comprising:

a plurality of detectors, each detector being a position-sensitive detector including a detection area comprising multiple pixels;

an electron source;

an optical imaging system configured to image at least a partial region of an object on the detection area of a given one of said detectors by means of the beam of transmission electrons which emanate from the object;

a deflector configured to direct the beam of transmission electrons from a first detector of the plurality of detectors to a second detector of the plurality of detectors; and a control system configured to control the deflector to direct the beam of transmission electrons from the first detector to the second detector, wherein an object plane of the optical imaging system is disposed between the electron source and the plurality of detectors, and wherein the first detector does not integrate intensity of transmission electrons impinging on its detection area during a dead time ($t_T$), and wherein the deflector is controllable by the control system to direct, during the dead time ($T_T$), the beam of transmission electrons to a detection area of the second detector of the plurality of detectors, which is different from the first detector, and wherein imaging and integrating associated with the second detector both occur during transmission of a first image from the first detector to a memory.

44. The apparatus according to claim 43, wherein the detection areas of the plurality of detectors are substantially disposed in an image area of the optical imaging system.

45. An apparatus for detecting position information contained in a beam of photoelectrons, comprising:

a plurality of detectors, each detector being a position-sensitive detector including a detection area comprising multiple pixels;

a photon source for illuminating an area of an object to generate the beam of photoelectrons;

an optical imaging system configured to image at least a partial region of an object on the detection area of a given one of said detectors by means of the beam of photoelectrons;

a deflector configured to direct the beam of photoelectrons from a first detector of the plurality of detectors to a second detector of the plurality of detectors; and a control system configured to control the deflector to direct the beam of charged particles from the first detector to the second detector, wherein the first detector does not integrate intensity of photoelectrons impinging on its detection area during a dead time ($t_T$), and wherein the deflector is controllable by the control system to direct, during the dead time ($t_T$), the beam of photoelectrons to a detection area of the second detector of the plurality of detectors, which is different from the first detector, and wherein imaging and integrating associated with the second detector both occur during transmission of a first image from the first detector to a memory.

46. The apparatus according to claim 45, wherein the detection areas of the plurality of detectors are substantially disposed in an image area of the optical imaging system.

47. An apparatus for detecting position information contained in a beam of photoelectrons, comprising:

a plurality of detectors, each detector being a position-sensitive detector including a detection area comprising multiple pixels;

a photon-electron converter;

a light-optical system configured to project a light image onto the photon-electron converter to thereby generate the beam of photoelectrons;

an optical imaging system configured to image at least a partial region of the photon-electron converter on the detection area of a given one of said detectors by means of the beam of photoelectrons;

a deflector configured to direct the beam of photoelectrons from a first detector of the plurality of detectors to a second detector of the plurality of detectors; and a control system configured to control the deflector to direct the beam of charged particles from the first detector to the second detector, wherein the first detector does not integrate intensity of photoelectrons impinging on its detection area during a dead time ($t_T$), and wherein the deflector is controllable by the control system to direct, during the dead time ($t_T$), the beam of photoelectrons to a detection area of the second detector of the plurality of detectors, which is different from the first detector, and wherein imaging and integrating associated with the second detector both occur during transmission of a first image from the first detector to a memory.

48. The apparatus according to claim 47, wherein the detection areas of the plurality of detectors are substantially disposed in an image area of the optical imaging system.

49. The apparatus according to claim 1, wherein the optical imaging system comprises a first optical lens, a second optical lens disposed between the first optical lens and the plurality of area sensors, and a third optical lens disposed between the second optical lens and the plurality of area sensors.

50. The apparatus according to claim 21, wherein the optical imaging system comprises a first optical lens, a second optical lens disposed between the first optical lens and the plurality of area sensors, and a third optical lens disposed between the second optical lens and the plurality of area sensors.

* * * * *

UNITED STATES PATENT AND TRADEMARK OFFICE
CERTIFICATE OF CORRECTION

PATENT NO.        : 7,084,406 B2
APPLICATION NO. : 10/294609
DATED             : August 1, 2006
INVENTOR(S)       : Rainer Knippelmeyer It is certified that error appears in the above-identified patent and that said Letters Patent is hereby corrected as shown below:

Column 6, line 34, "$t_B$" should be -- $t_B$ --.

Column 6, line 59, "$t_B$" should be -- $t_B$ --.

Column 6, line 63, "$t_A$" should be -- $t_A$ --.

Column 7, line 1, "$t_T$" should be -- $t_T$ --.

Column 7, line 1, "$t_B$" should be -- $t_B$ --.

Column 7, line 2, "$t_B$" should be -- $t_B$ --.

Column 7, line 2, "$t_T$" should be -- $t_T$ --.

Column 7, line 6, "$t_T$" should be -- $t_T$ --.

Column 7, line 6, "$t_B$" should be -- $t_B$ --.

Column 7, line 9, "$t_B$" should be -- $t_B$ --.

Column 7, line 14, "$t_B$" should be -- $t_B$ --.

Column 7, line 23, "$t_B$" should be -- $t_B$ --.

Column 7, line 27, "$t_E$" should be -- $t_E$ --.

Column 7, line 29, "$t_E$" should be -- $t_E$ --.

Column 7, line 30, "$t_T$" should be -- $t_T$ --.

Column 7, line 31, "$t_E$" should be -- $t_E$ --.

Column 7, line 32, "$t_B$" should be -- $t_B$ --.

Column 7, line 34, "$t_E$" should be -- $t_E$ --.

Column 7, line 46, "$t_T$" should be -- $t_T$ --.

Column 7, line 47, "$t_B$" should be -- $t_B$ --.

UNITED STATES PATENT AND TRADEMARK OFFICE
CERTIFICATE OF CORRECTION

PATENT NO. : 7,084,406 B2
APPLICATION NO. : 10/294609
DATED : August 1, 2006
INVENTOR(S) : Rainer Knippelmeyer It is certified that error appears in the above-identified patent and that said Letters Patent is hereby corrected as shown below:

Column 7, line 52, "$t_A$" should be -- $t_A$ --.

Column 7, line 55, "$t_A$" should be -- $t_A$ --.

Column 9, line 41, "$t_B$" should be -- $t_B$ --. (Both occurrences.)

Column 10, line 29, "$t_B$" should be -- $t_B$ --.

Column 10, line 37, "$t_B$" should be -- $t_B$ --.

Column 13, line 9, "$t_B$" should be -- $t_B$ --.

Column 13, line 16, "$t_A$" should be -- $t_A$ --.

Column 13, line 23, "$t_E$" should be -- $t_E$ --.

Column 13, line 33, "$t_T$" should be -- $t_T$ --.

Column 13, line 34, "$t_A$" should be -- $t_A$ --.

Claim 1, column 14, line 29, "of to given" should be --of the given --.

Claim 1, column 14, line 46, "$t_T$" should be -- $t_T$ --.

Claim 1, column 14, line 48, "$t_T$" should be -- $t_T$ --.

Claim 3, column 14, line 60, "$t_B$" should be -- $t_B$ --.

Claim 3, column 14, line 64, "$t_T$" should be -- $t_T$ --.

Claim 3, column 14, line 64, "$t_B$" should be -- $t_B$ --.

Claim 14, column 16, line 13, "transmissior" should be -- transmission --.

Claim 14, column 16, line 27, "$t_T$" should be -- $t_T$ --.

Claim 21, column 17, line 25, "$t_T$" should be -- $t_T$ --.

Claim 24, column 18, line 5, "$t_T$" should be -- $t_T$ --.

UNITED STATES PATENT AND TRADEMARK OFFICE
CERTIFICATE OF CORRECTION

PATENT NO.       : 7,084,406 B2
APPLICATION NO.  : 10/294609
DATED            : August 1, 2006
INVENTOR(S)      : Rainer Knippelmeyer It is certified that error appears in the above-identified patent and that said Letters Patent is hereby corrected as shown below:

Claim 38, column 18, line 62, "trough" should be -- through --.

Claim 41, column 19, line 29, "$t_T$" should be -- $t_T$ --.

Claim 41, column 19, line 30, "controls stem" should be -- control system --.

Claim 41, column 19, line 31, "$t_T$" should be -- $t_T$ --.

Claim 43, column 19, line 64, "$t_T$" should be -- $t_T$ --.

Claim 43, column 19, line 66, "$T_T$" should be -- $t_T$ --.

Claim 45, column 20, line 27, "$t_T$" should be -- $t_T$ --.

Claim 45, column 20, line 29, "$t_T$" should be -- $t_T$ --.

Claim 47, column 20, line 60, "$t_T$" should be -- $t_T$ --.

Claim 47, column 20, line 62, "$t_T$" should be -- $t_T$ --.

Signed and Sealed this

Twenty-fourth Day of April, 2007

JON W. DUDAS
*Director of the United States Patent and Trademark Office*